United States Patent [19]

Varadarajan

[11] Patent Number: 4,670,673
[45] Date of Patent: Jun. 2, 1987

[54] MULTILEVEL DIFFERENTIAL ECL/CML GATE CIRCUIT

[75] Inventor: Hemmige D. Varadarajan, Sunnyvale, Calif.

[73] Assignee: Advanced Micro Devices, Inc., Sunnyvale, Calif.

[21] Appl. No.: 702,962

[22] Filed: Feb. 19, 1985

[51] Int. Cl.$^4$ .......................................... H03K 19/086
[52] U.S. Cl. .................................. 307/455; 307/443; 307/475; 307/264
[58] Field of Search ............... 307/443, 455, 475, 494, 307/557–559, 264

[56] References Cited

U.S. PATENT DOCUMENTS

| | | | |
|---|---|---|---|
| 4,041,326 | 8/1977 | Robinson | 307/455 X |
| 4,215,418 | 7/1980 | Muramatsu | 307/455 X |
| 4,399,414 | 8/1983 | Bird | 307/358 X |
| 4,539,493 | 9/1985 | Varadarajan | 307/455 |
| 4,547,881 | 10/1985 | Varadarajan | 307/455 X |
| 4,560,888 | 12/1985 | Oida | 307/455 X |
| 4,563,600 | 1/1986 | Kobayashi et al. | 307/455 |

OTHER PUBLICATIONS

Itou et al, "ECL LSI Circuit Design", Review Elect. Comm. Labs., vol. 26, Nos. 9–10, Sep.–Oct. 1978, pp. 1339–1354.

Davis et al, "Sixteen-Input Funnel Utilizing Five–Level Differential Cascode Current Switch", IBM TDB, vol. 26, No. 7A, 12-1983, pp. 3515–3517.

Carter et al, "Cascode Parity Circuit", IBM TDB, vol. 24, No. 3, 8-1981, pp. 1705–1706.

Primary Examiner—Stanley D. Miller
Assistant Examiner—D. R. Hudspeth
Attorney, Agent, or Firm—Patrick T. King; Davis Chin; J. Vincent Tortolano

[57] ABSTRACT

A multilevel differential logic gate circuit for generating a plurality of levels of logic includes a single constant current source having its one end connected to a ground potential. The current source has a relatively small voltage drop. A first differential amplifier formed of a pair of first and second transistors have their emitters coupled together and to the other end of the current source to define a first level of logic. A second differential amplifier formed of a pair of third and fourth transistors have their emitters coupled together and to the collector of the first transistor to define a second level of logic. A third differential amplifier formed of a pair of fifth and sixth transistors have their emitters coupled together and to the collector of the third transistor to define a third level of logic. A fourth differential amplifier formed of a pair of seventh and eights transistors have their emitters coupled together and to the collector of the fifth transistor to define a fourth level of logic. The collector of the seventh transistor is connected to a supply potential via a first resistor. The collector of the eighth transistor is connected also to the supply potential via a second resistor.

16 Claims, 4 Drawing Figures

MULTILEVEL DIFFERENTIAL ECL/CML GATE CIRCUIT

This invention relates generally to bipolar logic gate circuits and more particularly, it relates to a multilevel differential emitter-coupled logic/current mode logic (ECL/CML) gate circuit which produces a plurality of levels of logic.

In order to enhance the capability of integrated circuits to perform logic functions, there has been used heretofore in the prior art series-gated devices or cascode logic where two or three levels of emitter-coupled logic are stacked on each other. Since ECL gate circuits use typically low voltage power supplies at a set value such as 5 volts and each level of logic requires a relatively large voltage swing, the number of ECL levels is generally limited to two or three levels. It would therefore be desirable to provide a gate arrangement which provides a higher order of series level gating to be achieved so as to yield an increased logic capability for a given amount of power consumption with relatively high speeds of operation.

SUMMARY OF THE INVENTION

Accordingly, it is a general object of the present invention to provide a multilevel differential emitter-coupled logic/current mode logic (ECL/CML) gate circuit which produces a large plurality of levels of logic.

It is an object of the present invention to provide a gate arrangement which permits a higher order of series level gating to be achieved.

It is another object of the present invention to provide a gating arrangement which utilizes conventional power supplies but yet has an increased number of logic functions.

It is still another object of the present invention to provide a gating arrangement which has increased logic capabilities but yet operates at relatively high speeds.

It is yet still another object of the present invention to provide a multilevel differential logic gate circuit for generating a plurality of levels of logic which includes a single current source and a plurality of differential amplifiers.

In accordance with these aims and objectives, the present invention is concerned with the provision of a multilevel differential logic gate circuit for generating a plurality of levels of logic which includes a single current source having its one end connected to a ground potential. The current source has a relatively low voltage drop. A first differential amplifier is formed of a pair of first and second transistors having their emitters coupled together and to the other end of the current source to define a first level of logic. A second differential amplifier is formed of a pair of third and fourth transistors having their emitters coupled together and to the collector of the first transistor to define a second level of logic. A third differential amplifier is formed of a pair of fifth and sixth transistors coupled together and to the collector of the third transistor to define a third level of logic. A fourth differential amplifier is formed of a pair of seventh and eighth transistors having their emitters coupled together and to the collector of the fifth transistor to define a fourth level of logic. The collector of the seventh transistor is connected to a supply potential via a first collector resistor. The collector of the eighth transistor is connected to the supply potential via a second collector resistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
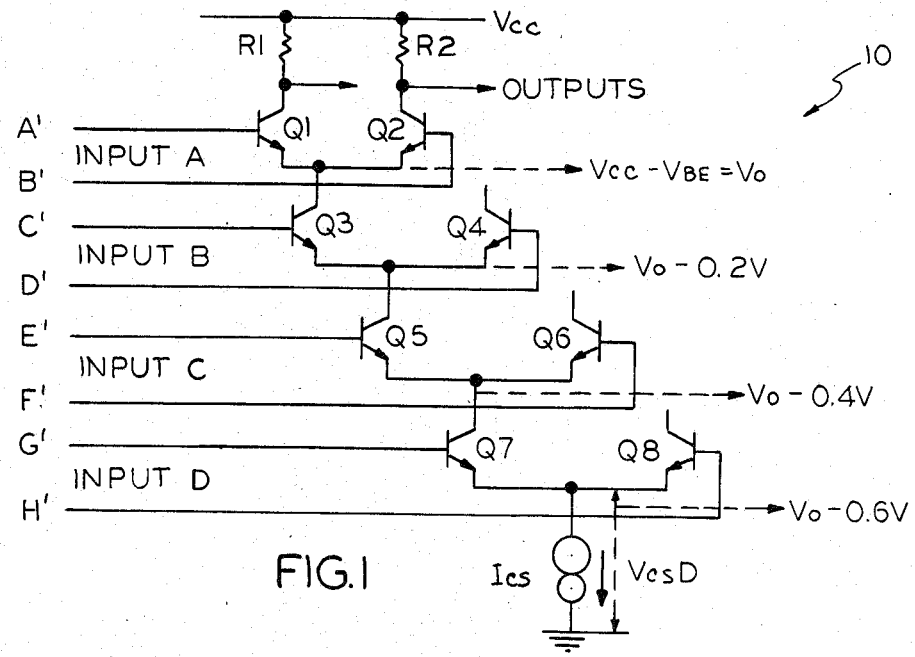
FIG. 1 is a schematic circuit diagram of a multilevel differential emitter-coupled logic/current mode logic gate circuit of the present invention.

Referring now in detail to the various views of the drawings, there is shown in FIG. 1 a schematic circuit diagram of a circuit arrangement 10 for a multilevel differential emitter-coupled logic (ECL) or current mode logic (CML) gate of the present invention which is capable of providing a plurality of n levels of logic. The circuit arrangement 10 includes a first differential amplifier formed of transistors Q1 and Q2 having their emitters coupled together. A supply voltage or potential $V_{CC}$ is connected to the collector of the transistor Q1 via a first collector resistor R1 and to the collector of the transistor Q2 via a second collector resistor R2. The base of the transistor Q1 is adapted to receive an input logic signal A. The base of the transistor Q2 is adapted to receive an input logic signal $\overline{A}$ which is the complement of the input logic signal A. In other words, when the input logic signal A is in the high or "1" level, the input logic signal $\overline{A}$ is in the low or "0" level. Thus, the bases of the transistors Q1 and Q2 are referred to as being "differentially" driven. A first output of the first differential amplifier is obtained from the collector of the transistor Q1, and a second output of the differential amplifier is obtained from the collector of the transistor Q2.

A second differential amplifier is provided which is formed of transistors Q3 and Q4 having their emitters coupled together. The collector of the transistor Q3 is connected to the common emitters of the first differential amplifier. The collector of the transistor Q4 may be connected to either the supply potential $V_{CC}$ or to common emitters of a differential amplifier (not shown) similar to the first differential amplifier so as to implement a desired logic function. The base of the transistor Q3 is adapted to receive an input logic signal B. The base of the transistor Q4 is adapted to receive an input logic signal $\overline{B}$ which is the complement of the input logic signal B. Thus, the bases of the transistors Q3 and Q4 are to be differentially driven. A first output of the second differential amplifier is obtained from the collector of the transistor Q3, and a second output of the second differential amplifier is obtained from the collector of the transistor Q4.

A third differential amplifier is provided which is formed of transistors Q5 and Q6 having their emitters coupled together. The collector of the transistor Q5 is connected to the common emitters of the second differential amplifier. The collector of the transistor Q6 may be connected to either the supply potential $V_{CC}$ or to common emitters of a differential amplifier (not shown) similar to the second differential amplifier. The base of the transistor Q5 is adapted to receive an input logic signal C. The base of the transistor Q6 is connected to receive an input logic signal $\overline{C}$ which is the complement of the input signal C. Thus, the bases of the transistor Q5 and Q6 are differentially driven. The first output of the third differential amplifier is obtained from the collector of the transistor Q5, and a second output of the third differential amplifier is obtained from the collector of the transistor Q6.

A fourth differential amplifier is provided which is formed of transistors Q7 and Q8 having their emitters coupled together. The collector of the transistor Q7 is connected to the common emitters of the third differential amplifier. The collector of the transistor Q8 may be connected to either the supply potential $V_{CC}$ or to common emitters of a differential amplifier (not shown) similar to the third differential amplifier. The base of the transistor Q7 is adapted to receive an input logic signal D. The base of the transistor Q8 is adapted to receive an input logic signal $\overline{D}$ which is the complement of the input signal D. A first output of the fourth differential amplifier is obtained from the collector of the transistor Q7, and a second output of the fourth differential amplifier is obtained from the collector of the transistor Q8.

A single constant current source designated as $I_{CS}$ is connected between the common emitters of the fourth differential amplifier and a ground potential. While only four differential amplifiers have been shown for ease of illustration, it should be understood that n additional levels of differential amplifiers may be connected between the fourth differential amplifier and the constant current source.

The designation n refers to an integer number between one and eleven so that it is possible to obtain a maximum of fifteen logic levels with a single current source. The limitation on the possible number of levels is due to the minimum supply voltage, the voltage drop across the current source and the voltage drops across the base-emitter and collector-emitter terminals of the transistors, which will be explained in detail hereinafter.

As used herein, the term "gate" in the field of semiconductor electronics refers to a circuit which performs a specified logic function. While the nomenclature ECL and CML are often used interchangeably, the gate arrangement of FIG. 1 is in actuality a CML gate as opposed to an ECL gate. As properly defined, current mode logic is an emitter-coupled logic gate without emitter followers.

For ECL or CML circuits, the supply voltage level V is typically specified by convention to have a minimum value of 4.3 volts. This convention is based upon the nominal specification of ECL circuits as operating at 5 volts with a tolerance of ±10%. Consequently, the worse case low voltage from the voltage supply is 5 volts minus 0.1×5 volts or 4.5 volts. Assuming for large-scale-integration (LSI) an on-chip voltage drop of 200 mv between the input power terminal and the most remote circuit elements, this results in the very worst power supply voltage to be 4.5 volts minus 200 mv or the 4.3 volts as was previously stated.

Since ECL or CML circuits are also specified generally to operate within the full military temperature range of −55° C. to +155° C., the worst case occurs at the low end of the temperature range due to the fact that all of the transistors in the circuit will have a high base-to-emitter voltage drop $V_{BE}$ on the order of 900 mv. Finally, it is assumed that there will be a voltage drop, such as 1.1 volt at 25° C. across the constant current source $V_{CS}$. Accordingly, the number of logic levels will be limited to the worst supply voltage of 4.3 volts minus the $V_{BE}$ of 900 mv and the voltage drop across the current source $V_{CS}$ of 1.1 volts or 2.3 volts which is available for the n levels of logic.

Assuming that a 200 mv increment is needed for each level of logic, this would mean that twelve levels of series-gated or cascode logic are possible. If the voltage drop across the current source $V_{CS}$ were reduced to 0.5 volts, then fifteen levels of logic would be obtainable. It has been found that by differentially driving each level of logic there is made possible the dropping of only 0.2 volts per logic level.

As can be seen from FIG. 1, the voltage $V_0$ at the emitter coupling point of the first differential amplifier for the first level of logic is equal to $V_{CC}-V_{BE}$. the voltage at the emitter coupling point of the second differential amplifier is 0.2 volts below the voltage $V_0$ of the first logic level or $V_0-0.2$ volts. Similarly, the voltage at the emitter coupling point of the third differential amplifier is 0.2 volts below the voltage of the second logic level or $V_0-0.4$ volts. Further, the voltage at the emitter coupling point of the fourth differential amplifier is 0.2 volts below the voltage of the third logic level or $V_0-0.6$ volts. It should be understood that the voltages at all of the emitter coupling points do not change when the input signal is varied between a logic "1" level and the logic "0" level. This facilitates the use of a low voltage swing.

Figure 2:
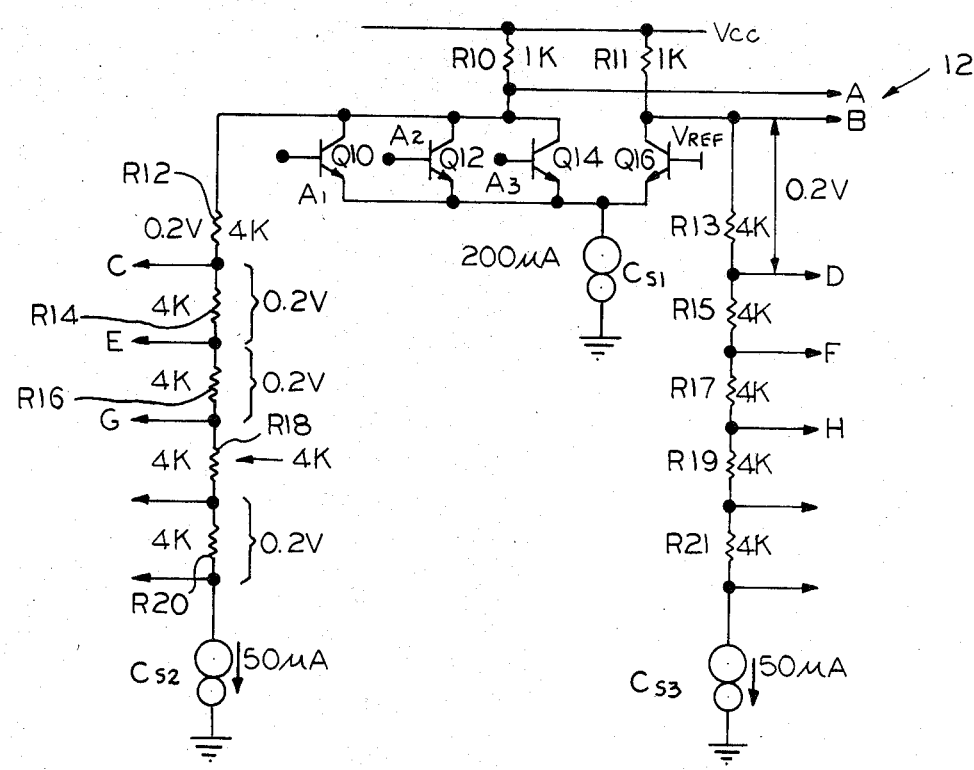
FIG. 2 is a schematic circuit diagram of a differential driver input circuit for the gate circuit arrangement of FIG. 1.

A first embodiment of a differential driver input circuit 12 for differentially feeding the input at each level of logic of the circuit arrangement of FIG. 1 is depicted in FIG. 2. The differential driver input circuit 12 includes a plurality of input logic transistors Q10, Q12, and Q14 and a reference transistor Q16. All of the emitters of the input transistors Q10, Q12 and Q14 are connected together and to the emitter of the reference transistor Q16. A main current source CS1 is connected between the common emitters of the transistors Q14 and Q16 and a ground potential. All of the collectors of the input transistors Q10, Q12 and Q14 are also connected together and to a supply potential $V_{CC}$ via a resistor R10. Each of the bases of the input transistors are adapted to receive respective input logic signals A1, A2 and A3. The collector of the reference transistor Q16 is connected to the supply potential $V_{CC}$ via a resistor R11. The base of the reference transistor Q16 is connected to a reference voltage $V_{REF}$.

The common collector of the input transistors are connected to one end of first output load driver devices formed of a first series-connected string of resistors R12, R14, R16, R18 and R20. The collector of the input transistor Q10 is connected to the transistor R12. A first load current source CS2 is connected between the load resistor R20 and a ground potential. The collector of the reference transistor Q16 is connected to one end of second output load driver devices formed of a second series-connected string of resistors R13, R15, R17, R19 and R21. The collector of the reference transistor Q16 is connected to the load resistor R13. A second load current source CS3 is connected between the load resistor R21 and the ground potential.

A first pair of differential ouputs for driving the first logic level of FIG. 1 is taken from the collectors of the transistors Q14 and Q16. One of the outputs from a second pair of differential outputs for driving the second logic level is taken between the load resistors R12 and R14. The other output of the second pair of differential outputs for driving the second logic level is taken between the resistor R13 and R15. One of the outputs from a third pair of differential outputs for driving the third logic level is taken between the resistors R14 and R16. The other output of the third pair of differential outputs for driving the third logic level is taken between the resistors R15 and R17. One of the outputs from a fourth pair of differential outputs from driving the fourth logic level is taken between the resistors R16 and R18. The other output of the fourth pair of differential outputs for driving the fourth logic level is taken between the resistors R17 and R19. One of the outputs from a fifth pair of differential outputs for driving a fifth logic level is taken between the resistors R18 and R20. The other output of the fifth pair of differential outputs for driving the fifth logic level is taken between the resistors R19 and R21. Finally, one of the outputs from a sixth pair of differential outputs for driving a sixth logic level is taken between the resistor R20 and the load current source CS2. The other output of the sixth pair of differential outputs for driving the sixth logic level is taken between the resistor R21 and the load current source CS3.

Figure 3:
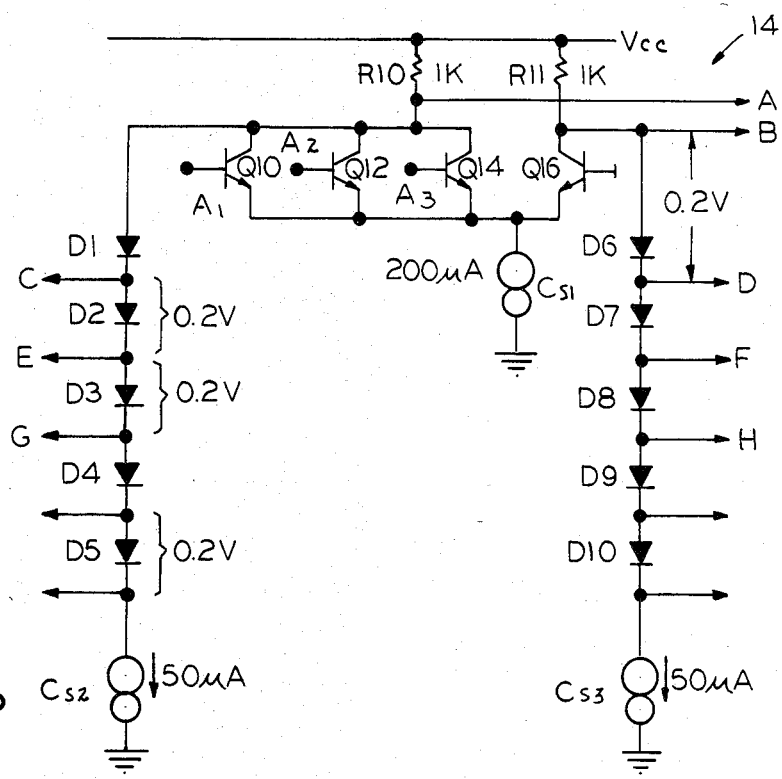
FIG. 3 is a second embodiment of a differential driver input circuit for the gate circuit arrangement of FIG. 1.

A second embodiment of a differential drive input circuit 14 for differentially feeding the inputs at each level of the circuit arrangement of FIG. 1 is shown in FIG. 3. As can be seen by comparing FIGS. 2 and 3, the only difference is that all of the resistors of FIG. 2 have been replaced with translation or level-shifting diodes D1 through D10. Otherwise, the circuit components and operation are the same as FIG. 2.

Figure 4:
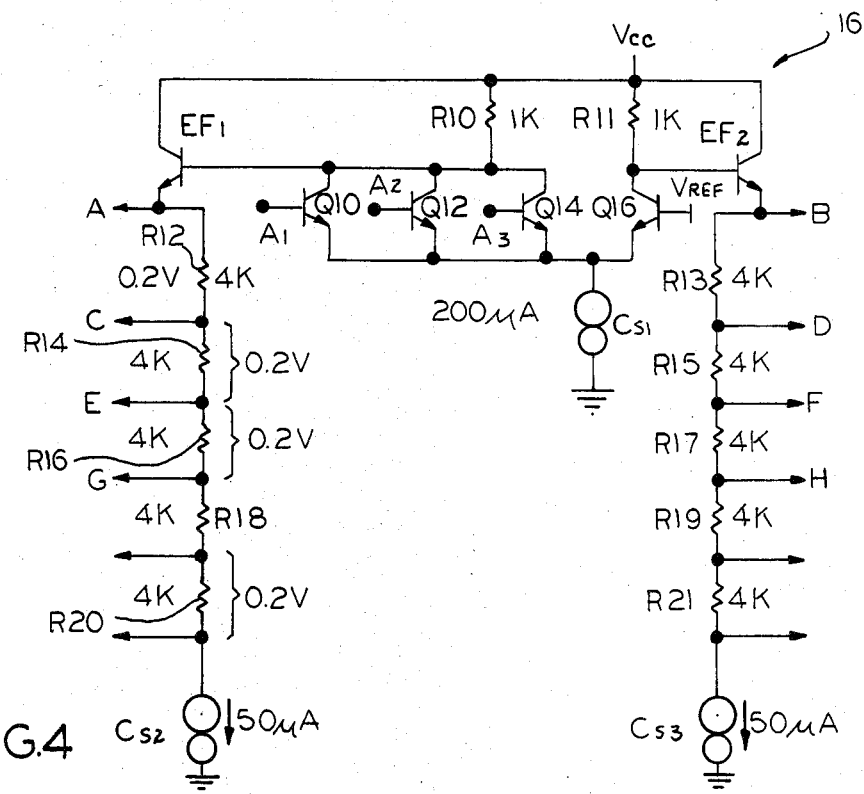
FIG. 4 is a third embodiment of a differential driver input circuit for the gate circuit arrangement of FIG. 1.

A third embodiment of a differential drive input circuit 16 for differentially feeding the input at each level of the circuit arrangement of FIG. 1 is illustrated in FIG. 4. By comparing FIGS. 2 and 4, it would be noted that emitter follower transistors EF1 and EF2 have been inserted. More specifically, the junction of the resistor R10 and the collector of the transistor Q10 is connected to the base of the emitter follower transistor EF1. The collector of the emitter follower transistor EF1 is connected to the supply potential $V_{CC}$. The emitter of the emitter follower transistor is connected to the supply potential $V_{CC}$. Similarly, the junction of the resistor R11 and the collector of the reference transistor Q16 is connected to the base of the emitter follower transistor EF2. The collector of the emitter follower transistor EF2 is connected to the supply potential $V_{CC}$, and the emitter of the emitter follower transistor EF2 is connected to the resistor R13. It should also be understood that all of the translation resistors of the FIG. 4 may also be replaced by translation diodes similar to that of FIG. 3.

The differential driver circuits of FIGS. 2, 3 or 4 may be connected for differentially feeding the inputs of the circuit arrangement of FIG. 1 by joining lines A, B, C, D, E, F, G and H of FIGS. 2, 3 or 4 with the corresponding lines A', B', C', D', E', F', G' and H' of FIG. 1. Alternatively, the input line pairs A'–B', C'–D', etc. may each be driven by separate differential driver circuits.

From the foregoing detailed description, it can thus be seen that the present invention provides a multilevel differential logic gate circuit for generating a plurality of levels of logic which is formed of a single current source and a plurality of differential amplifiers. Due to the differential drive, more levels of logic are obtainable with the same supply voltage as used in a single-ended ECL circuit since a lower usable swing of 200 mv for each level is permitted. Further, the emitter coupling point does not change as the input logic signal goes between a logic "1" level and a logic "0" level. Thus, the gate arrangement of the present invention allows higher order series level gating to be achieved for a given amount of power consumption but yet operating at relatively high speeds.

While there has been illustrated and described what is at present to be considered a preferred embodiment of the present invention, it will be understood by those skilled in the art that various changes and modifications may be made, and equivalents may be substituted for elements thereof, without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all the embodiments falling within the scope of the appended claims.

What is claimed is:

1. A multilevel differential logic gate circuit for generating a plurality of levels of logic comprising:
    a single constant current source having its one end connected to a ground potential, said current source having a relatively small voltage drop;
    a first differential amplifier formed of a pair of first and second transistors having their emitters coupled together and to the other end of said current source to define a first level of logic;
    a second differential amplifier formed of a pair of third and fourth transistors having their emitters coupled together and to the collector of said first transistor to define a second level of logic;
    a third differential amplifier formed of a pair of fifth and sixth transistors having their emitters coupled together and to the collector of said third transistor to define a third level of logic;
    a fourth differential amplifier formed of a pair of seventh and eighth transistors having their emitters coupled together and to the collector of said fifth transistor to define a fourth level of logic;
    said collector of said seventh transistor being connected to a supply potential via a first resistor, said collector of said eighth transistor being connected to the supply potential via a second resistor;
    said bases of the transistors in said first through fourth differential amplifiers being connected to receive differential input logic signals for the respective first through fourth levels of logic; and
    said collectors of the transistors in said first through fourth differential amplifiers generating differential output voltages for the respective first through fourth levels of logic, said differential output voltages between each adjacent level of logic having a voltage difference of approximately 200 mv.

2. A gate circuit as claimed in claim 1, wherein at least one additional differential amplifier is provided to define at least one additional level of logic, said at least one differential amplifier being connected between said first and second resistors and said fourth differential amplifier.

3. A gate circuit as claimed in claim 1, wherein n additional differential amplifiers are provided to define n additional levels of logic, said n differential amplifiers being connected between said first and second collector resistors and said fourth differential amplifiers, n being an integer number between 1 and 11.

4. A gate circuit as claimed in claim 1, wherein the voltage drop across said current source is 1.1 volts.

5. A gate circuit as claimed in claim 1, wherein the voltage drop across said current source is 0.5 volts.

6. A gate circuit as claimed in claim 1, wherein the collectors of said second, fourth, sixth and eighth transistors are connected to common emitters of additional differential amplifiers.

7. A gate circuit as claimed in claim 1, wherein the collectors of said second, fourth, sixth and eighth transistors are connected to the supply potential.

8. A gate circuit as claimed in claim 1, further comprising a differential drive input circuit for generating said differential input logic signals for the respective first through fourth levels of logic which includes a plurality of input transistors having their emitters connected together, a reference transistor having its emitter connected to the common emitters of said input transistors, the input transistors having their collectors connected together and to a supply voltage via a first load resistor, the reference transistor having its collector connected to the supply voltage via a second load resistor, the bases of said input transistors being for receiving input logic signals, the base of said reference transistor being connected to a reference voltage, the common emitters of said input transistors and said reference transistor being connected to a main constant current source, the common collectors of said input transistors being connected to first output load driver devices, the collector of said reference transistor being connected to second output load driver devices, said first output load devices being further connected to a first load current source, said second output load driver devices being further connected to a second load current source.

9. A gate circuit as claimed in claim 8, wherein said first output load driver devices comprise a first series-connected string of resistors, and wherein said second output load driver devices comprise a second series-connected string of resistors.

10. A gate circuit as claimed in claim 8, wherein said first output load driver devices comprise a first seris-connected string of translation diodes, and wherein said second output load driver devices comprise a second series-connected string of translation diodes.

11. A gate circuit as claimed in claim 8, wherein pairs of differential input logic signals are obtained from said first and second output load driver devices.

12. A gate circuit as claimed in claim 8, wherein a first emitter follower transistor is connected between the collectors of said input transistors and said first output load driver devices, and wherein a second emitter follower is connected between the collector of said reference transistor and said second output load driver devices.

13. A differential driver input circuit comprising:
a plurality of input transistors having their emitters coupled together;
a reference transistor having its emitter connected to the common emitters of said input transistors;
said input transistors having their collectors connected together and to a supply voltage via a first resistor, said reference transistor having its collector connected to the supply voltage via a second resistor;
the bases of said input transistors being connected to receive input logic signals, the base of said reference transistor being connected to a reference voltage;
a main current source connected between the common emitters of said input transistors and said reference transistor and a ground potential;
the common collectors of said input transistors being connected to a plurality of first output load driver devices;
the collector of said reference transistor being connected to a plurality of second output load driver devices;
said plurality of said first output load driver devices being further connected to a first load current source, said plurality of said second output load driver devices being further connected to a second load current source; and
said plurality of said first output load driver devices consisting of a first series-connected string of ressitors, and said plurality of said second output load driver devices consisting of a second series-connected string of resistors.

14. A driver input circuit as claimed in claim 13, wherein pairs of differential logic signals are obtained from said first and second output load driver devices.

15. A driver input circuit as claimed in claim 13, wherein a first emitter follower is connected between the collectors of said input transistors and said first output load driver devices, and wherein a second emitter follower transistor is connected between the collector of said reference transistor and said second output load driver devices.

16. A differential driver input circuit comprising:
a plurality of input transistors having their emitters coupled together;
a reference transistor having its emitter connected to the common emitters of said input transistors;
said input transistors having their collectors connected together and to a supply voltage via a first resistor, said reference transistor having its collector connected to the supply voltage via a second resistor;
the bases of said input transistors being connected to receive input logic signals, the base of said reference transistor being connected to a reference voltage;
a main current source connected between the common emitters of said input transistors and said reference transistor and a ground potential;
the common collectors of said input transistors being connected to a plurality of first output load driver devices;
the collector of said reference transistor being connected to a plurality of second output load driver devices;
said plurality of said first output load driver devices being further connected to a first load current source, said plurality of said second output load driver devices being further connected to a second load current source; and
said plurality of said first output load driver devices consisting of a first series-connected string of translation diodes, and said plurality of said second output load driver devices consisting of a second series-connected string of translation diodes.

* * * * *